(12) United States Patent
Anikitchev

(10) Patent No.: US 8,071,908 B1
(45) Date of Patent: Dec. 6, 2011

(54) EDGE WITH MINIMAL DIFFRACTION EFFECTS

(75) Inventor: Serguei G. Anikitchev, Belmont, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 12/079,325

(22) Filed: Mar. 26, 2008

(51) Int. Cl.
*B23K 26/00* (2006.01)

(52) U.S. Cl. ............... 219/121.65; 219/121.73

(58) Field of Classification Search ........... 219/121.65, 219/121.73; 438/795; 250/515.1
See application file for complete search history.

(56) References Cited

U.S. PATENT DOCUMENTS

| | | | | |
|---|---|---|---|---|
| 3,977,772 | A * | 8/1976 | Rimmer et al. | 359/739 |
| 4,650,287 | A * | 3/1987 | Kudo et al. | 250/515.1 |
| 5,212,387 | A * | 5/1993 | Swan | 250/515.1 |
| 5,760,881 | A * | 6/1998 | Miyazaki et al. | 250/548 |
| 6,259,055 | B1 * | 7/2001 | Sokol et al. | 219/121.68 |
| 6,617,600 | B1 * | 9/2003 | Hawryluk et al. | 250/505.1 |
| 6,747,245 | B2 | 6/2004 | Talwar et al. | |
| 2004/0173585 | A1 | 9/2004 | Talwar et al. | |
| 2004/0188396 | A1 | 9/2004 | Talwar et al. | |
| 2004/0266223 | A1 * | 12/2004 | Tanaka et al. | 438/795 |
| 2005/0067384 | A1 | 3/2005 | Talwar et al. | |
| 2005/0103998 | A1 | 5/2005 | Talwar et al. | |
| 2005/0148208 | A1 * | 7/2005 | Chang et al. | 438/795 |
| 2006/0163223 | A1 * | 7/2006 | Zhang et al. | 219/121.73 |
| 2006/0176920 | A1 * | 8/2006 | Park | 372/38.02 |
| 2006/0237403 | A1 * | 10/2006 | Shareef et al. | 219/121.65 |
| 2006/0252282 | A1 * | 11/2006 | Talwar et al. | 438/795 |
| 2007/0068908 | A1 * | 3/2007 | Grek et al. | 219/121.8 |

FOREIGN PATENT DOCUMENTS

| | | | | |
|---|---|---|---|---|
| JP | 10-223554 | A | * | 8/1998 |
| JP | 2000-58478 | A | * | 2/2000 |
| JP | 2004-247717 | A | * | 9/2004 |
| JP | 2009-18336 | A | * | 1/2009 |

OTHER PUBLICATIONS

Machine translation of Japan Patent No. 10-223,554.*
Machine translation of Japan Patent document No. 2000-58,478, Apr. 2010.*
Machine translation of Japan Patent document No. 2004-247,717, Apr. 2010.*
Auerbach et al., "Serrated-aperture apodizers for high -energy laser systems", May 1994, Applied Optics, vol. 33, No. 15, pp. 3179-3183.*

* cited by examiner

*Primary Examiner* — Geoffreys Evans
(74) *Attorney, Agent, or Firm* — Allston L. Jones; Peters Verny, LLP

(57) ABSTRACT

Apparatuses and methods are provide thermally processing of the central portion of a substrate surface using a scanned photonic beam. Such thermal processing is carried out using a shield to block the beam from illuminating the side wall or peripheral portion of the substrate. The shield has characteristics, e.g., diffractive characteristics, effective to maintain the intensity of any unblocked portion of beam suitable for processing the central portion of the substrate surface.

20 Claims, 11 Drawing Sheets

EDGE WITH MINIMAL DIFFRACTION EFFECTS

BACKGROUND OF THE INVENTION

1. Field of Invention

The present invention relates generally to methods and apparatuses for processing a surface of a substrate using a photonic beam. More specifically, the invention relates to methods and apparatuses that carry out such processing in a manner that shields sidewalls and periphery of substrates from the beam without producing detrimental diffraction effects.

2. Description of Related Art

Coherent and incoherent laser technologies may be used to carry out thermal processing semiconductor-based microelectronic devices such as processors, memories and other integrated circuits (ICs) that require thermal processes. For example, the source/drain parts of transistors may be formed by exposing regions of a silicon wafer substrate to electrostatically accelerated dopants containing boron, phosphorous or arsenic atoms. After implantation, the interstitial dopants are electrically inactive and require activation. Activation may be achieved by using a laser to heat the entirety or a portion of the substrate to a particular processing temperature for a period of time sufficient for the crystal lattice to incorporate the impurity atoms into its structure.

Lasers and laser diodes may be used to rapidly heat the wafer to temperatures near the semiconductor melting point to incorporate dopants at substitutional lattice sites, and then rapidly cooling the wafer to "freeze" the dopants in place. This rapid thermal cycle "activates" the dopant atoms in the junction areas without appreciably changing the dopant atom distribution. As a result, an ideal box-like activated dopant profile, as substantially defined by the implant process rather than by the subsequent heating, is created. Exemplary terminology used to describe laser-based thermal processing techniques include laser thermal processing (LTP), laser thermal annealing (LTA), and laser spike annealing (LSA). In some instances, these terms can be used interchangeably.

Laser processing techniques typically involve forming a laser beam into a long, thin image, which in turn is quickly scanned across a surface to be heated, e.g., an upper surface of a semiconductor wafer. In the time that it takes for the beam to pass over a particular location on the surface of the wafer, that location is raised to an annealing temperature. Almost as quickly, that location is cooled to the bulk temperature of the wafer. Additional information regarding laser-based processing apparatuses and methods can be found in U.S. Pat. No. 6,747,245 and U.S. Patent Application Publication Nos. 2004/0188396, 2004/0173585, 2005/0067384, and 2005/0103998 each to Talwar et al.

LTP may employ either pulsed or continuous radiation from any of a number of sources. For example, conventional LTP may use a continuous high-power $CO_2$ laser beam, which is coherent in nature. The $CO_2$ laser beam is raster scanned over the wafer surface such that all regions of the surface are exposed to at least one pass of the heating beam. Similarly, a laser diode bar may be used to produce an incoherent beam for scanning over the wafer surface.

In general, illumination uniformity (both macro- and micro-uniformity) over the useable portion of the laser beam image is a highly desirable trait. This ensures that the corresponding heating of the substrate is correspondingly uniform. Similarly, the energy delivered from the laser should be generally stable over time, e.g., energy per pulse for pulse radiation applications and laser beam power for continuous radiation applications, so that all exposed regions are successively heated to a uniform temperature. In short, illumination uniformity and stability is generally a desirable characteristic for any laser used for semiconductor annealing applications.

To ensure uniform heating, it is desirable to employ a beam whose intensity profile has a useful flat-top useful portion so that the intensity does not deviate more than 1% of the beam's peak intensity. Ideally the maximum temperature seen by any point on the wafer should be kept within 10° C. For example, a continuous coherent $CO_2$ laser beam having a Gaussian intensity profile may be manipulated to form a useful flat-top portion of about 0.1 mm wide and about 7 mm long. Raster scanning the beam across a wafer surface at a constant velocity of 100 mm/s results in a 1-millisecond dwell time for the heating cycle. A typical maximum temperature during this heating cycle might be about 1350° C. for silicon wafers. Within the dwell time needed to bring the wafer surface up to the maximum temperature, a layer of only about 100 to about 200 micrometers below the surface region is heated. The bulk of the millimeter thick wafer serves to cool the surface almost as quickly, as it was heated once the laser beam is past.

Uniform wafer surfaces (e.g., bare or unpatterned) exhibit uniform light absorption behavior. Consequently, it is a fairly straightforward matter to use a scanned laser beam of an appropriate intensity profile to heat substantially the entirety of a uniform substrate surface to a uniform peak temperature simply by selecting an appropriate scan path and rate.

The incidence angle for laser processing uniform wafer surfaces may vary. For certain processes, the laser beam may be directed from a laser beam source at a zero incidence angle toward the wafer surface (zero incidence angle means the beam is normal to the surface). More commonly, however, the beam may be directed toward the surface at a nonzero incidence angle. In such instances, the beam may be directed to the wafer surface at or near the Brewster's angle for the surface to ensure maximum beam energy absorption. For bare silicon wafer surfaces, the Brewster's angle is approximately 75°.

It has been discovered that surfaces of commercially available silicon wafers may be advantageously processed using a coherent laser beam at a high incidence angle, e.g., about 75°. However, as side walls of silicon wafers are typically perpendicular to the wafer surface, the high angle of incidence on the surface of the wafer leads to a nearly normal (about 15° from normal) incident beam on the wafer sidewall directly facing the beam. If a beam that strikes the wafer surface at an incidence angle of about 75° simultaneously strikes the side wall of the wafer, the side wall will experience a nearly 4-fold increase in the incident beam intensity. Such a phenomenon is discussed in detail below. In any case, as set forth in U.S. patent application Ser. No. 11/447,623, entitled "Apparatuses and Methods for Irradiating a Substrate to Avoid Substrate Edge Damage", inventors Markle and Grek, this can result in serious wafer damage and even fracture of the entire wafer.

Also at risk are the edges of the wafer which are typically ground down and have many microfractures. As peripheral regions of the wafer surface adjacent to the edges may also contain microfractures, semiconductor-device manufacturers typically do not form microelectronic components in the peripheral regions. Illuminating these edges with a high intensity laser beam can cause the wafer to crack or shatter due to the propagation of the microfractures. Therefore, it is necessary to shield both the edge (or sidewall) of the wafer as well as the peripheral region of the wafer.

Consequently, one possible way to avoid the problem of overexposing the side wall and peripheral region of the wafer is to shield that portion of the wafer that faces incident direction of the beam. Conceptually, this could be done by placing a physical shield to either absorb or reflect the light that would normally strike the edge (or sidewall) or the peripheral region of the wafer. Nevertheless, blocking a sidewall of a wafer from a beam intended to process the surface of the same wafer is not a trivial matter due to diffractive interference from the physical shield. Such diffractive interference may render any unblocked portion of beam unsuitable for processing the substrate surface. In particular, it has been discovered that when a coherent beam is used, diffractive interference may create localized beam intensity fluctuations of about 60%.

Thus, it is evident that opportunities exist in the art to improve laser thermal processes and to overcome the problems associated with laser shielding and diffractive interference.

SUMMARY OF THE INVENTION

In a first embodiment, the invention provides an apparatus for processing a surface of a substrate having a central portion and a peripheral portion bounded by a substrate side wall. The apparatus includes a radiation source, a stage, a relay, a shield, and a controller. The radiation source is adapted to emit a photonic beam. The stage is adapted to support and move the substrate. The relay is adapted to direct the photonic beam from the radiation source toward the substrate surface at an intensity profile suitable for processing the central portion of the substrate surface. The shield is interposed between the relay and the stage and is adapted to block the beam from illuminating the side wall or peripheral portion in a manner that maintains the suitable intensity profile of any unblocked portion of the beam for processing the central portion of the substrate surface. The controller is operably coupled to the radiation source, relay, shield and/or stage and adapted to provide relative scanning movement between the stage and the beam to allow the beam to scan over and process the central portion of the substrate surface in a substantially uniform manner.

In another embodiment, the invention provides a method for illuminating a surface of a substrate as described above using a beam having an intensity profile that exhibits a peak intensity. The method involves generating a photonic beam and directing the photonic beam toward the substrate surface at an incidence angle so the beam illuminates the central portion of the substrate surface. Notably, a shield is included to block the beam from illuminating the substrate side wall or peripheral portion of the surface. The shield has diffractive characteristics effective to maintain the peak intensity of any unblocked portion of beam suitable for processing the central portion of the substrate surface.

In a further embodiment, the invention provides a method for illuminating a surface of a semiconductor substrate, e.g., a round silicon wafer, comprising directing a photonic beam of a peak intensity toward the substrate surface so an unaltered portion of the beam forms an image on the substrate surface while another portion of the beam illumination is blocked by a shield, wherein the shield has diffractive characteristics effective to ensure that the image is substantially free from any intensity spike that substantially exceeds the peak intensity of the photonic beam.

For any of the above embodiments, the photonic beam may be generated by any of a number of coherent or incoherent radiation sources. When the beam is formed from a $CO_2$ laser, the beam may have a wavelength of about 10.6 µm. The beam may be manipulated by a relay to form an elongate image that is formed for the beam striking the surface of the substrate at an incidence angle that is greater than about 45°, e.g., about 75°.

The shield composition may vary. In general, the shield typically has a melting temperature and/or reflectivity higher than that of the substrate surface. For example, the shield may be metallic. Metals having a higher melting temperature than silicon include, for example, molybdenum. Typically, the shield has a greater thermal conductivity than the substrate. The greater thermal conductivity may serve to ensure that the shield does not fail from excessive localized heating.

The shield may vary by geometry as well. In general, the shield may have an edge with a contour of diffractive characteristics that are effective to block the beam from the peripheral portion or the substrate side wall without detrimental modulation of the intensity profile. Preferably, but necessarily, the edge contour is substantially parallel to and index feature on the substrate surface.

Optionally, the edge contour includes a plurality of substantially identical V-shaped grooves and/or protrusions. The grooves and protrusions may be evenly spaced, e.g., each groove may have a neighboring groove and neighboring grooves may be equidistant to each other, and have an angle of about 55° to about 65°. Each groove or protrusion may have a vertex region with a radius that is less than about five times the beam wavelength or less than about 50 micrometers. Neighboring protrusions and/or grooves may have a vertex-to-vertex distance of about 10 to about 250 times the beam wavelength.

Figure 1:
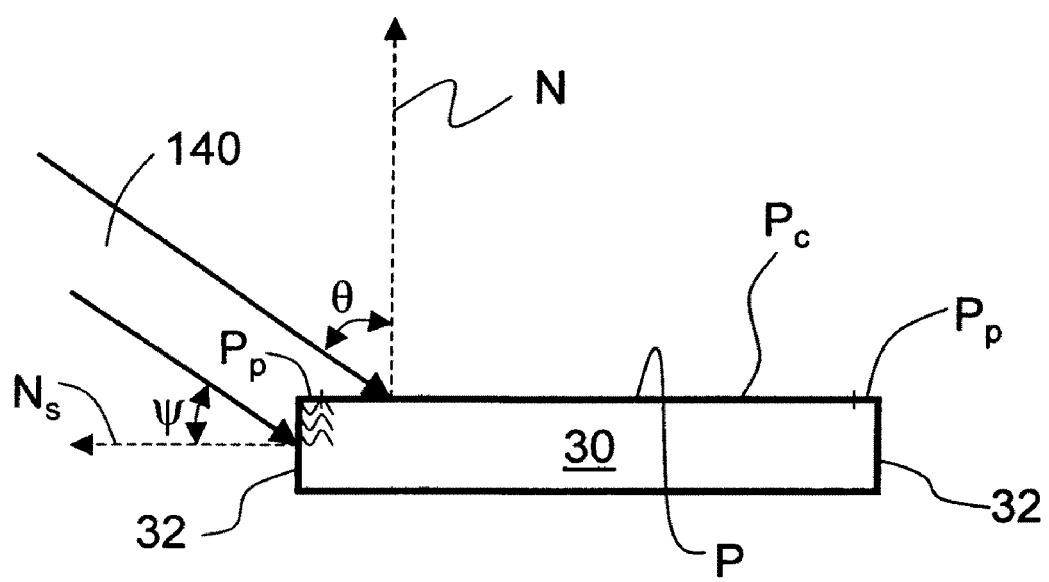
FIG. 1 is a schematic side view of an exemplary laser thermal processing geometry of a substrate with an upper surface and a perpendicular side wall.

The drawings are intended to illustrate various aspects of the invention, which can be understood and appropriately carried out by those of ordinary skill in the art. The drawings may not be to scale as certain features of the drawings may be exaggerated for emphasis and/or clarity of presentation.

DETAILED DESCRIPTION OF THE INVENTION

Definitions and Overview

Before describing the present invention in detail, it is to be understood that this invention, unless otherwise noted, is not limited to specific substrates, lasers, or materials, all of which may vary. It is also to be understood that the terminology used herein is for the purpose of describing particular embodiments only, and is not intended to be limiting.

It must be noted that, as used in this specification and the appended claims, the singular forms "a", "an" and "the" include both singular and plural referents unless the context clearly dictates otherwise. Thus, for example, reference to "a beam" includes a plurality of beams as well as a single beam, reference to "a wavelength" includes a range or plurality of wavelengths as well as a single wavelength, and the like.

In describing and claiming the present invention, the following terminology will be used in accordance with the following definitions.

The terms "Brewster's angle" or "Brewster angle" is used to refer to the angle of incidence between a radiation beam and a surface that corresponds to the minimum or near-minimum reflectivity of the P-polarized component of the beam. Films on the surface of an object, such as a silicon wafer, may prevent it from exhibiting zero reflectivity at any angle. If, however, the films are dielectric in nature, then there generally will be an angle of minimum reflectivity for P-polarized radiation. Accordingly, the Brewster's angle as used herein for a specular surface formed from a variety of different films stacked on a substrate can be thought of as having an effective Brewster's angle, or the angle at which the reflectivity of P-polarized radiation is at a minimum. This angle of minimum reflectivity typically coincides with or is near the angle of the Brewster's angle for the substrate material.

The term "intensity profile" in reference to an image or a beam refers to the distribution of the integrated radiation intensity along one or more dimensions. For example, an image may have a useful portion and a non-useful portion. The useful portion of an image typically has a "uniform" or constant integrated intensity profile over some portion of its length. In other words, the intensity profile integrated in the scan direction throughout the useful portion of the image may be substantially constant. Accordingly, any point on a substrate surface region that is scanned by a useful portion of an image having a uniform intensity profile will be heated to the same temperature. However, the intensity or intensity profile of the non-useful portion may differ from that of the useful portion. Thus, the image as a whole may have an overall "non-uniform" intensity profile even though a useful portion by itself may exhibit a uniform intensity profile.

As a related matter, the term "peak intensity value" of an image or a beam refers to the point along the beam length exhibiting the highest integrated intensity across the beam width. Typically, the entirety of the useful portion of an image will exhibit an integrated intensity very close to the peak integrated intensity.

As another related matter, the term "energy utilization" as in the "energy utilization of an image" refers to the proportion of energy associated with the portion of the image useful for producing a desired effect relative to the total beam energy in the image. For example, in an annealing application the "useful portion" of an image may be only that part of the beam that comes within about a percent or two of the maximum or peak beam intensity. In such a case, the "useful portion" exhibits a "substantially uniform" intensity. A small modification to the image profile shape can produce a large change in the "energy utilization".

The term 'semiconductor" is used to refer to any of various solid substances having electrical conductivity greater than insulators but less than good conductors, and that may be used as a base material for computer chips and other electronic devices. Semiconductors include elements such as silicon and germanium and compounds such as silicon carbide, aluminum phosphide, gallium arsenide, and indium antimonide. Unless otherwise noted, the term "semiconductor" includes any one or a combination of elemental and compound semiconductors, as well as strained semiconductors, e.g., semiconductors under tension or compression. Exemplary indirect bandgap semiconductors suitable for use with the invention include Si, Ge, and SiC. Direct bandgap semiconductors suitable for use with the invention include, for example, GaAs, GaN, and InP.

The terms "substantial" and "substantially" are used in their ordinary sense and refer to matters that are considerable in importance, value, degree, amount, extent or the like. For example, the phrase "substantially Gaussian in shape" refers to a shape that corresponds predominantly to the shape of a Gaussian probability distribution curve. However, a shape that is "substantially Gaussian" may exhibit some characteristics of a non-Gaussian curve as well, e.g., the curve may also include a non-Gaussian component.

Similarly, a "substantially uniform" intensity profile will contain a relatively flat portion where the intensity does not deviate more than a few percent from the profile's peak intensity. Preferably, the intensity deviation is less than about 2%. Optimally, the intensity deviation is no more than about 1% or no more than about 0.8%. Other uses of the term "substantially" involve an analogous definition.

The term "substrate" as used herein refers to any material having a surface, which is intended for processing. The substrate may be constructed in any of a number of forms, for example, such as a semiconductor wafer containing an array of chips, etc.

As discussed above, the invention generally provides for apparatuses and methods for thermally processing the central portion of a substrate surface using a scanned photonic beam in a manner that does not allow the beam to illuminate the side wall or peripheral portion of the substrate. Such thermal processing is carried out using a shield to block the beam from illuminating the side wall or peripheral portion of the substrate. An important aspect of the invention relates to the observation that a shield with an unsuitable edge contour may render the intensity profile of any unblocked portion of beam unsuitable for processing the central portion of the substrate surface. For example, an unsuitable edge contour may produce diffraction effects that produces an intensity spike that substantially exceeds the peak intensity of the photonic beam. As a result, an important aspect of the invention relates to a shield having diffractive characteristics effective to maintain the peak intensity of any unblocked portion of beam suitable for processing the central portion of the substrate surface.

Sidewall and Surface Periphery Heating

In order to elucidate the novel and nonobvious aspects of the invention, a discussion of the phenomenon of sidewall and surface periphery heating associated with laser thermal processes is warranted. FIG. 1 is a schematic side view of an exemplary laser thermal processing geometry involving a substrate 30 with an upper surface P with an associated surface normal N. Substrate 30 includes a side wall 32 with an associated side wall normal $N_s$. Substrate 30 includes a narrow annular peripheral portion $P_p$ that circumscribes the central portion $P_c$ of upper surface P and is adjacent to side wall 32. In some instances, the central portion represents a region of the substrate where full yield is expected when producing semiconductor devices such as integrated circuits and the peripheral portion represents an edge exclusion region, i.e. a portion of the substrate in which yield is not expected and sometimes where no device or portion thereof lies.

Substrate 30 is shown being irradiated with a radiation beam 140 that performs LTP of the substrate by scanning the beam over the upper surface. Radiation beam 140 is incident upon substrate upper surface P at a surface incident angle θ with respect to surface normal N. Surface incident angle θ may be, for example the (effective) Brewster angle for the substrate. The intensity I of radiation beam 140 at substrate surface P is given by $I=I_o \cdot \cos \theta$, wherein $I_o$ is the baseline radiation intensity measured normal to the radiation beam.

When irradiating the substrate at a high incident angle θ (e.g., ~75°) with scanned radiation beam 140, distal side wall 32 on the far side of the substrate 30 (relative to the incident direction of the radiation beam 140) never sees the incident radiation beam. However, proximal side wall 32 of the substrate 30 (relative to the incident direction of the radiation beam 140) is prone to exposure by radiation beam 20. Further, radiation beam 140 makes an incident angle ψ with respect to side wall normal $N_s$, wherein ψ=90°−θ. Thus, if θ=75°, then ψ=15°. Accordingly, the intensity I at the near side wall 32 is approximately 3.73 times greater than the intensity at surface P. This can raise the near-side substrate edge temperature to a level sufficient to cause damage (e.g., form fractures in the substrate).

Exemplary Laser-Based Thermal Processing Technology

Figure 2:
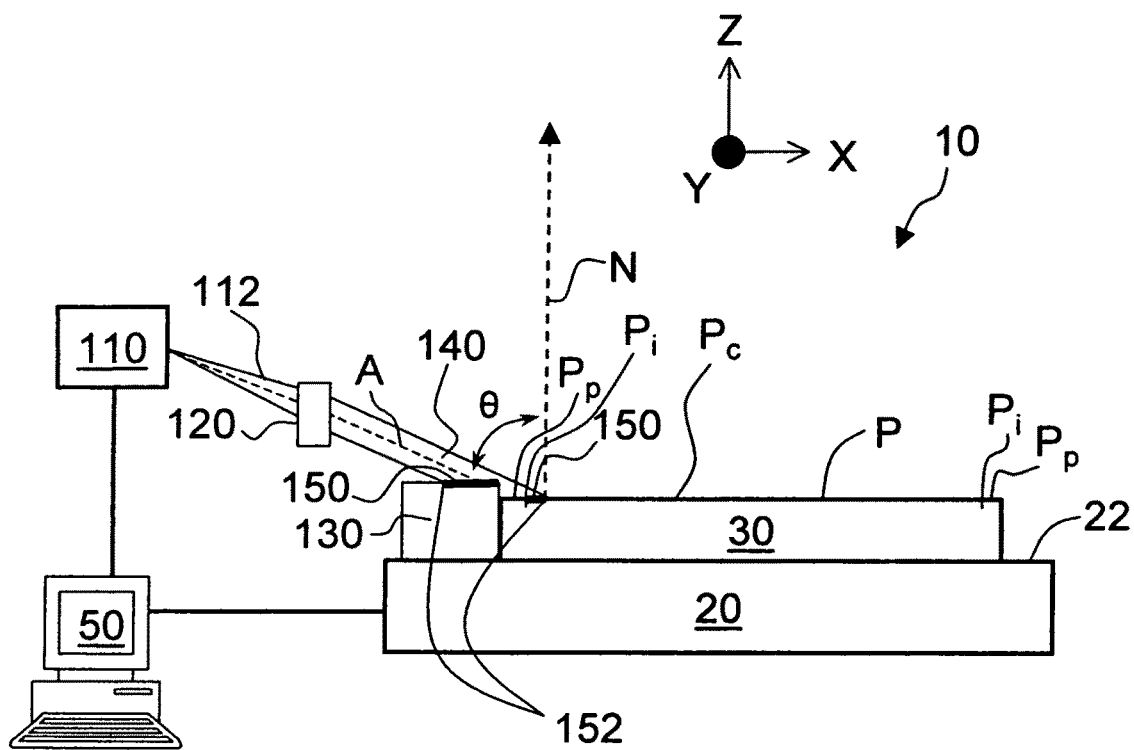
FIG. 2 schematically depicts a simplified exemplary embodiment of the inventive thermal processing apparatus.

The problem shown in FIG. 1 may be solved by blocking the portion of radiation beam 140 that strikes wafer peripheral sidewall 32 and optionally peripheral portion $P_p$ of the wafer surface P. FIG. 2 is a schematic diagram of a simplified exemplary embodiment of a thermal processing apparatus 10 that may be used to anneal and/or otherwise thermally process one or more selected surface regions of a substrate using a coherent laser beam according to the present invention. LTP system 10 includes a movable substrate stage 20 having an upper surface 22 that supports a semiconductor substrate 30 having a generally circular upper surface P and a surface normal thereto. The substrate surface P has a central portion $P_c$ that is circumscribed by a peripheral portion $P_p$. The central portion $P_c$ interfaces peripheral portion $P_p$ at $P_i$. As shown, side wall 32 (see FIG. 1) is perpendicular to and bounds the substrate surface P.

Substrate stage 20 is operably coupled to controller 50. Substrate stage 20 is adapted to move in the X-Y plane under the operation of controller 50 so the substrate can be scanned relative to the image generated from radiation provided by radiation source 110. Optionally, the stage 20 may also controllably rotate substrate 30 about an axis Z which extends orthogonally relative to the X-Y plane. As a result, the stage 20 may controllably fix or alter the orientation of substrate 30 in the X-Y plane.

In some instances, the stage may include different components to carry out different functions. For example, an alignment system may be provided to position the substrate on the stage at a variable orientation angle relative to the surface normal. In that case, the stage may independently control the substrate movement while the alignment system controls the substrate orientation.

The radiation source 110 is also operably coupled to controller 50. There is a relay 120 that serves to relay radiation generated by radiation source 110 toward the substrate to form an image on its surface. In an exemplary embodiment, radiation source 110 is a $CO_2$ laser that emits coherent radiation at a wavelength $\lambda_H \sim 10.6$ μm in the form of beam 112. However, the radiation suitable for use with the invention may include LED or laser diode radiation as well, e.g., radiation having a wavelength of about 0.8 μm. Optionally, a plurality of radiation sources may be employed. As shown, the laser 110 generates an input beam 112 that is received by a relay 120 that is adapted to convert the input beam to an output beam that forms an image on the substrate.

Optionally, the intensity profile of the beam is manipulated so a portion of the image intensity is rendered uniform about its peak intensity for even heating and high energy utilization. For example, relay 120 may transform an input beam 112 of a substantially Gaussian intensity profile into output beam 140. The relay may be constructed in a manner to provide a desired coherent beam shaping so the output beam exhibits a uniform intensity profile over a substantial portion of the image. For example, output beam 140 may have a flat top intensity profile. In short, relay 120 and radiation source 110 in combination may stabilize, the directionality, intensity profile, and phase profile of the output beam to produce a consistently reliable laser annealing system.

Figure 3:
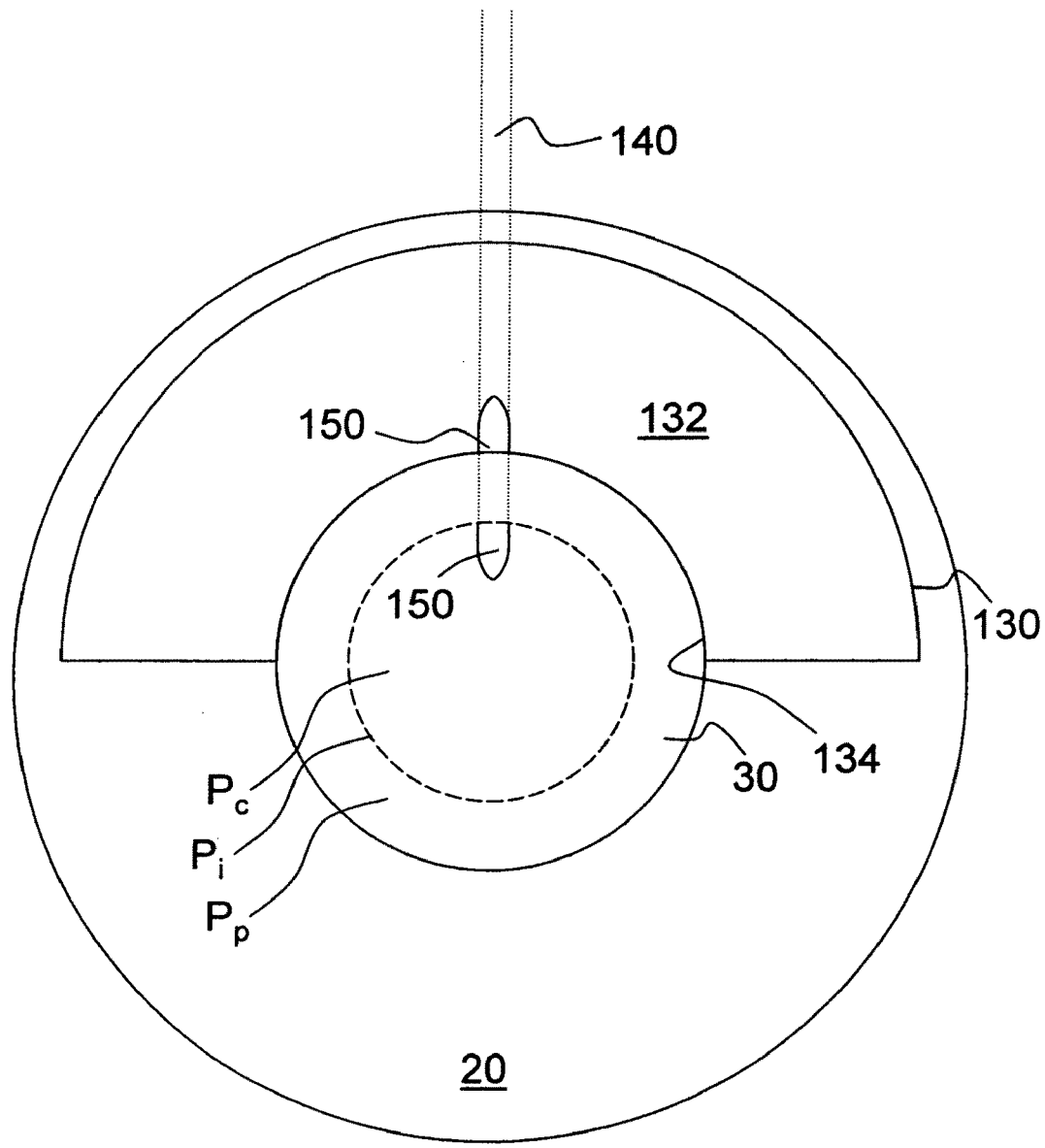
FIG. 3 schematically depicts a top view of the spatial relationship of stage, substrate and a shield having a smooth edge contour of a thermal processing apparatus.

Interposed between relay 120 and substrate 30 on stage 20 is a shield 130. As shown in FIGS. 2 and 3, shield 130 is immobilized on upper surface 22 of stage 20. The shield has an upper surface 132 that terminates at edge 134. The edge 134 has a contour that lies in a plane that is substantially parallel to the position of interface $P_i$ on upper surface P the substrate 30. The contour also runs parallel to the interface $P_i$ between the central portion $P_c$ and the peripheral portion $P_p$ of surface P.

Beam 140 travels along optical axis A, as shown in FIG. 2 which makes an angle θ with substrate surface normal N. Typically, it is not desirable to image a laser beam on a substrate at normal incidence, because any reflected light may cause instabilities when it reflects back into the laser cavity. Another reason for providing optical axis A at an incidence angle θ other than at normal incidence, is that efficiently coupling of beam 140 onto substrate 30 may best be accomplished by judicious choice of an incidence angle and a polarization direction, e.g., making the incidence angle equal to the Brewster's angle for the substrate and using p-polarized radiation. In any case, the stage may be adapted to scan the substrate through the beam position while preserving or altering the incidence angle. Similarly, the stage may be adapted to control, fix or vary the orientation angle of the substrate relative to the beam. The selection of the incidence and/or orientation angle is discussed below.

Beam 140 forms image 150 at substrate surface P. In an exemplary embodiment, image 150 is an elongate image, such as a line image, having its lengthwise boundaries indicated by 152, and located within a plane containing the incident beam axis and the surface normal. Accordingly, the incidence angle of the beam (θ) relative to the substrate surface may be measured in this plane. As shown in FIGS. 2 and 3, image 150 is located partially on surface 132 of the shield 130 and partially on the central portion of the substrate surface P. The position and height of shield 130 on surface 22 of stage 20 is selected to correspond to the selected incidence angle of the beam (θ) with surface 132 of shield 130 at a greater height above surface 22 of stage 20 than surface P of substrate 30 is above surface 22 of stage 20, thus, effectively, the shield 130 blocks a portion of the beam 140 from illuminating the side wall 32 of the substrate 30 as well as the peripheral portion $P_p$ of the substrate surface P.

Controller 50 may be programmed to provide relative movement between stage 20 and beam 140. Either stage 20 or laser beam 140 can be moved, or both; the motion of one relative to the other. As a result, the image may be scanned across the substrate surface to heat at least a portion of the substrate surface. Such scanning may be carried out in a manner effective to achieve a desired temperature within a predetermined dwell time, D. Scanning may typically be performed in a direction that is orthogonal to the lengthwise axis of the image although this is not a definite requirement. Non-orthogonal and non-parallel scanning may be carried out as well. A means may also be included to provide feedback as to the uniformity of the maximum temperature achieved. Various temperature measuring means and methods may be used with the invention. For example, a detector array might be used to take a snap-shot of the emitted radiation distribution over the surface or multiple snap-shots might be used to derive a map of the maximum temperature as a function of the position across the length of the beam image. Optionally, a means for measuring the intensity profile of the beam on the substrate may be used as well.

Optimally, a real-time temperature measurement system may be employed that can sense the maximum temperature with a spatial resolution preferably comparable to the thermal diffusion distance and with a time constant less than, or preferably comparable to, the dwell time of the scanned beam.

Diffraction Effects

Continuing with the apparatus shown in FIG. 2, it should be noted that when radiation beam 140 is coherent, as is typically the case for LTP or other irradiative processes requiring a high-power beam, shield 130 blocks a portion of the radiation beam 140 before it reaches substrate sidewall 32 and diffracts the radiation beam. The diffracted radiation interferes constructively or destructively with the portion of the beam directly incident on the substrate, depending on the position. This causes some portions of the regions on substrate surface P to be overexposed while other regions are underexposed. The variation in exposure caused by diffraction can be 20% to 60% or more.

This phenomenon is illustrated in FIG. 3, which schematically depicts a top view of the spatial relationship of stage 20, substrate 30 and a shield 130 of an apparatus similar to that shown in FIG. 2. As shown, beam 140 travels along optical axis A and forms elongate image 150 that is located partially on top surface 132 of shield 130 and partially on central portion $P_c$ of the substrate surface P. The portion of image 150 located on surface 132 of the shield 130 represents radiation blocked from the substrate surface P.

Figure 4:
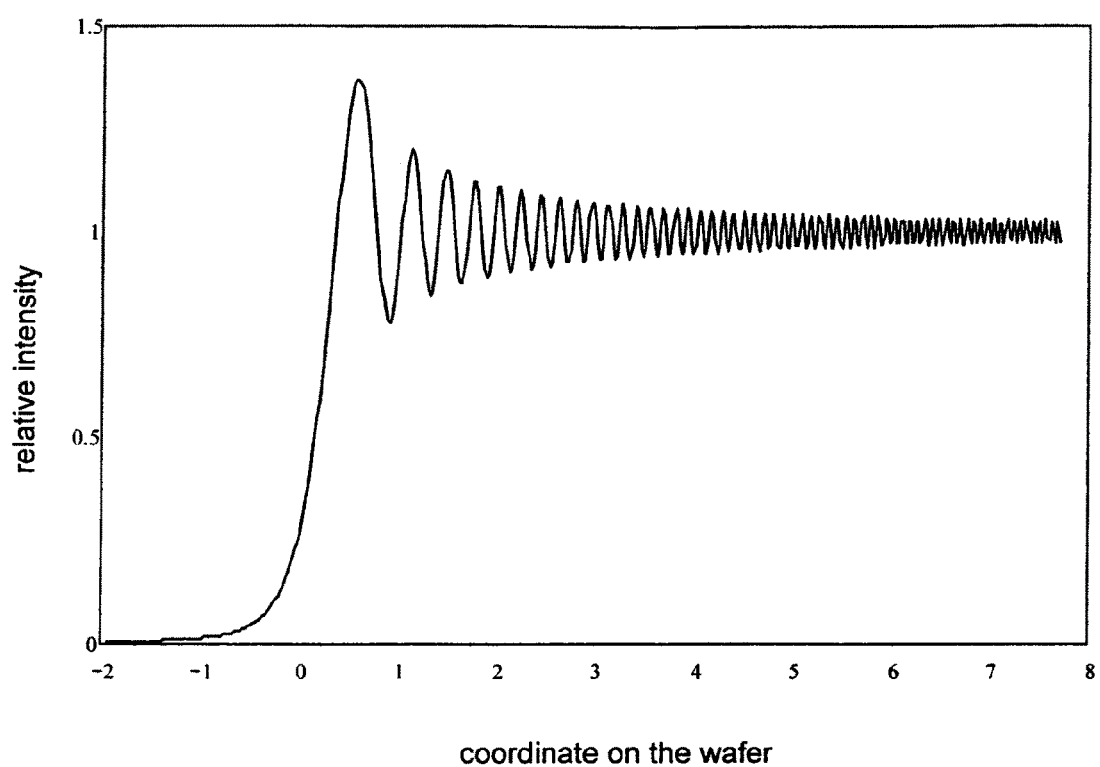
FIG. 4 is a plot the theoretical intensity profile of a beam after interacting with the shield edge contour shown in FIG. 2.

When beam 140 is coherent in nature and has a flat top intensity profile, e.g., has a normalized peak intensity of one or unity, any image formed by the beam on surface P in the absence of shield 130 would have a corresponding flat top intensity profile. However, it should be noted that shield 130 as shown in FIG. 3 has an edge 134 with a smooth contour generally parallel to the position of interface $P_i$. Thus, while the portion of the image 150 on surface 132 of the shield 130 would generally have a flat top intensity profile, the smooth edge 134 of the shield 130 interacts with beam 140 so the portion of the image 150 on the central portion $P_c$ of substrate surface P no longer exhibits a flat top intensity profile. Instead, the calculated intensity profile of the portion of image 150 on the substrate surface P is shown in FIG. 4. The intensity variations created by the interaction represents a significant deviation from the normalized peak intensity of the beam without the diffractive interference. From visual inspection, it is apparent that the interference pattern associated with the interaction of beam 140 with the profile of smooth edge 134 may cause substrate 30 to be heated to an absolute temperature that deviates by a range of about ±20% relative to the peak temperature that would have been achieved absent the interference.

Figure 5:
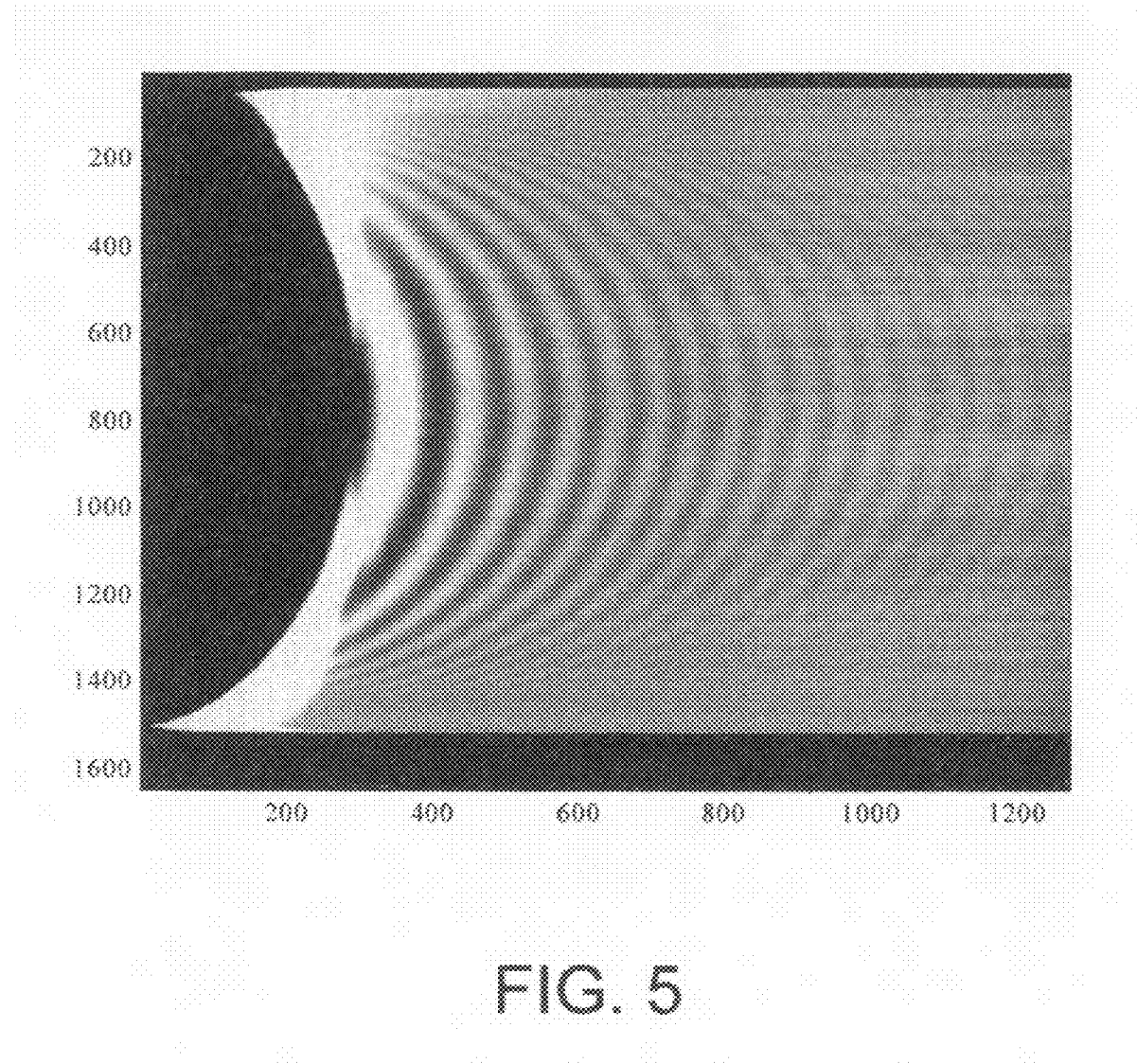
FIG. 5 shows a photograph of interference patterns formed on a surface due to the interaction of a coherent laser beam of a flat-top intensity profile with a shield having a smooth edge contour that partially blocks a portion of the beam from illuminating the surface.
Figure 6:
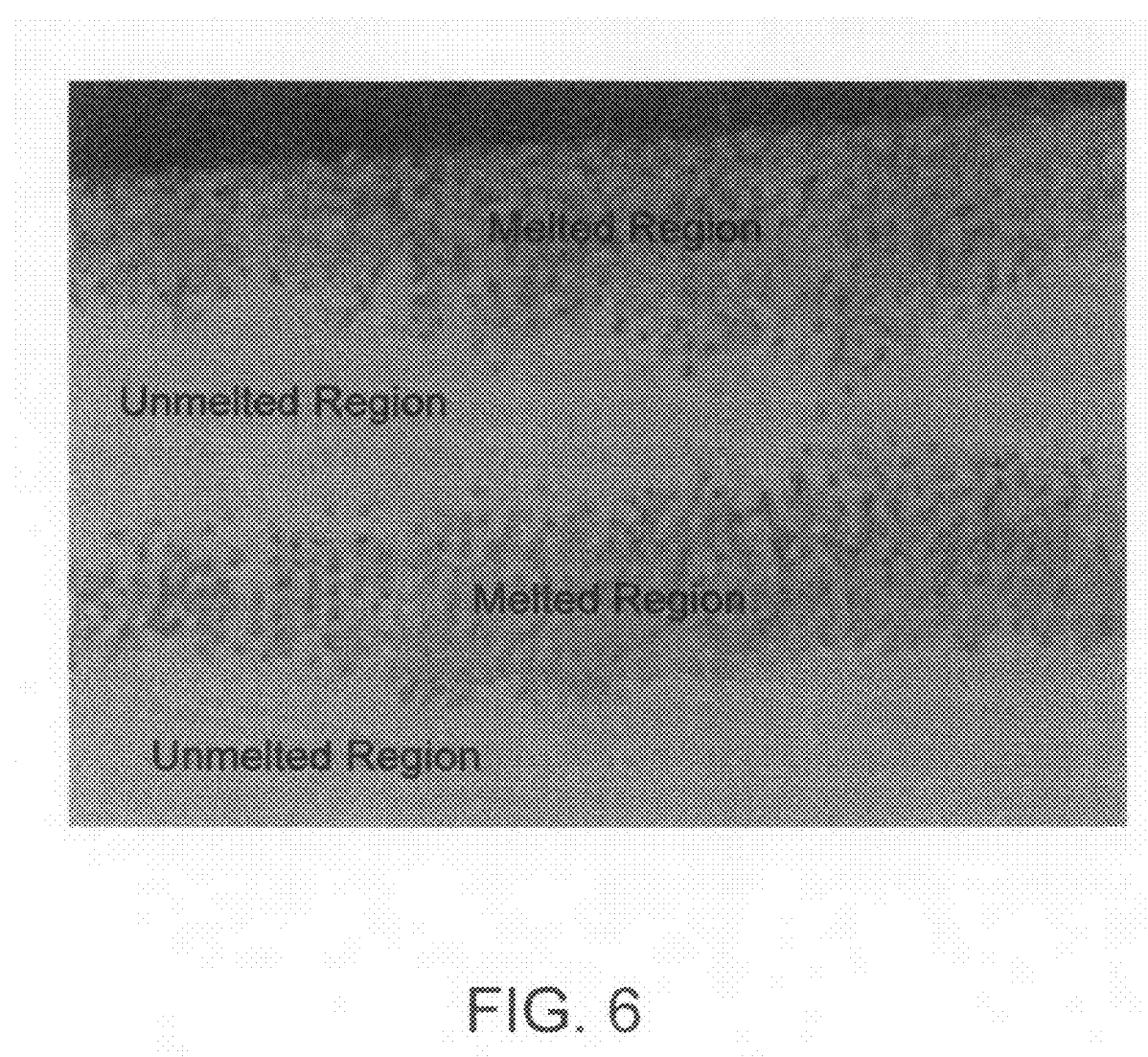
FIG. 6 shows a photograph of wafer having undergone thermal processing that resulted in the formation of alternating melted and unmelted bands on the wafer surface.

Such intensity variations have been experimentally observed. For example, FIG. 5 shows a photograph of interference patterns formed on a surface due to diffractive interaction between a coherent laser beam and a shield with a smooth edge contour. Similarly, FIG. 6 shows a wafer having undergone thermal processing using a laser beam that is partially blocked by a shield having an edge profile that diffracts the beam in a manner results in the formation of alternating melted and unmelted bands on the wafer surface.

Shield Design and Implementation

It has been discovered that so-called "soft edges" used in other laser based systems may be employed to mitigate diffraction effects associated with the technologies described herein. Such soft edges may be created though a number of ways. For example, FIG. 7, which schematically depicts a top view of the spatial relationship of an apparatus similar to that shown in FIG. 3 that also include a stage 20, substrate 30 and a shield 130. However, shield 130 in FIG. 7 has an edge 134 with an evenly spaced v-grooved contour instead of a smooth contour as shown in FIG. 3. The v-grooves alternate with pointed protrusions. As surface 132 is parallel to upper surface P of the substrate 30, the edge contour 134 is generally parallel to the position of interface $P_i$ on the surface of substrate 30.

Figure 8:
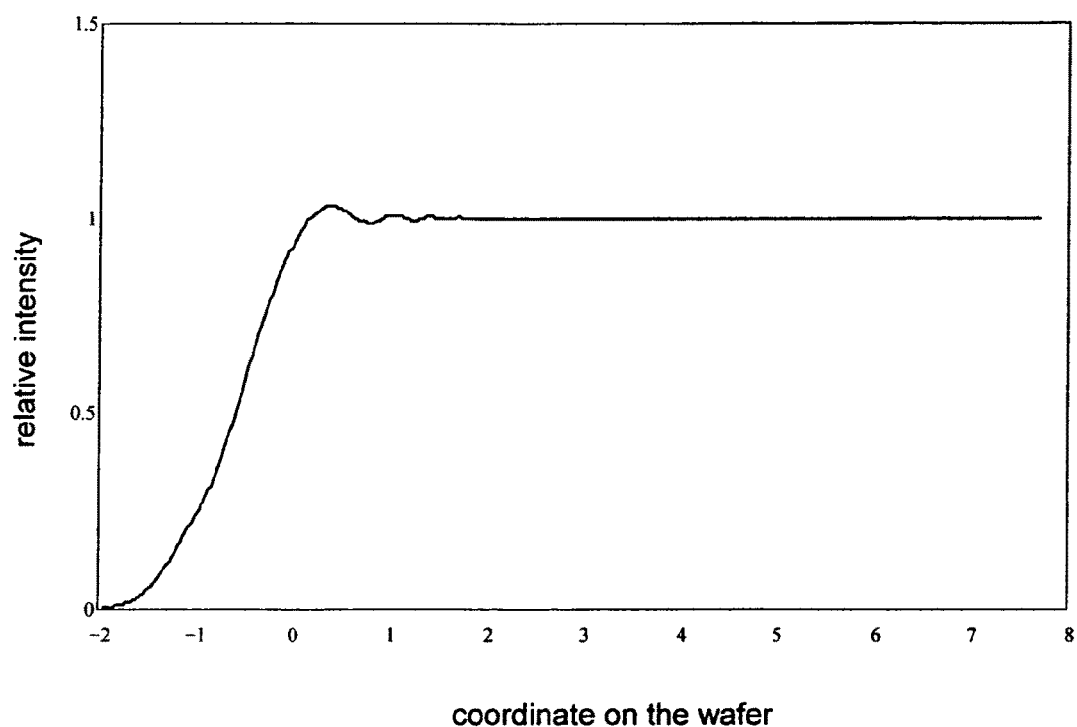
FIG. 8 is a plot of the intensity profile of a beam after interacting with the shield edge contour shown in FIG. 7.

Again, as shown in FIG. 3, coherent beam 140 having an flat-top intensity profile is shown traveling along optical axis A and forming elongate image 150 that is located partially on surface 132 of the shield 130 and partially on the central portion $P_c$ of the substrate surface P. Given the jagged contour of the v-grooves of the shield edge 132, the portion of the image 150 on the central portion $P_c$ of substrate surface P exhibits a flat top intensity profile. In effect, shield 130 blocks beam 140 from illuminating the peripheral side wall 32 of substrate 30, or peripheral portion thereof, in a manner that maintains the intensity profile of any unblocked portion of beam 140 suitable for processing the central portion of the substrate surface. The intensity profile of the image 150 on the substrate surface P when shield edge 132 has the v-grooves is shown in FIG. 8.

A number of shield edge geometries may be employed. In general, the shield may have an edge or contour of diffractive characteristics effective to block the beam from the peripheral portion of the substrate side wall without detrimental modulation of the intensity profile of the image on surface P of the substrate. In addition, the grooves or spaces between the protrusions may allow the amplitude and phase of the electric field diffractively produced from one side to cancel that from another. The net result should approximate a set of dense grooves that drastically reduces the amplitude of the intensity oscillations.

There are two operational issues associated with the implementation of such a shield. The first issue relates to the creation an analytical model and a computational procedure, which reasonably approximates the effect of a fabricated edge profile. Those of ordinary skill in the art are capable to verifying the model and procedure experimentally to address any differences between what can be reasonably modeled and what can practically fabricated. The second issue is related to the fabrication of an edge profile that closely approximates the ideal profile employed in the analytical model.

Figure 7:
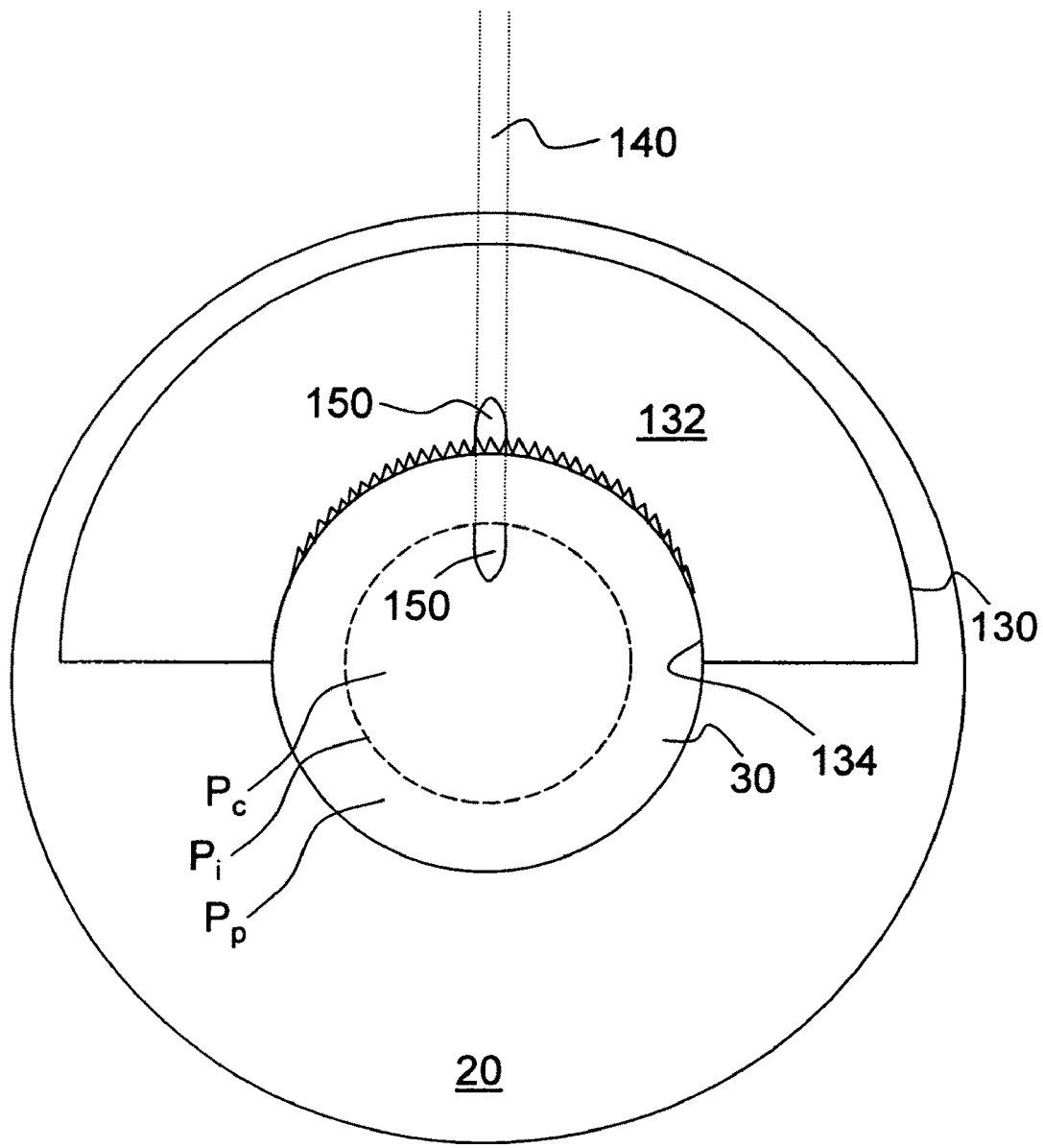
FIG. 7 schematically depicts a top view of the spatial relationship of stage, substrate and a shield having a grooved edge contour of an improved thermal processing apparatus.
Figure 10:
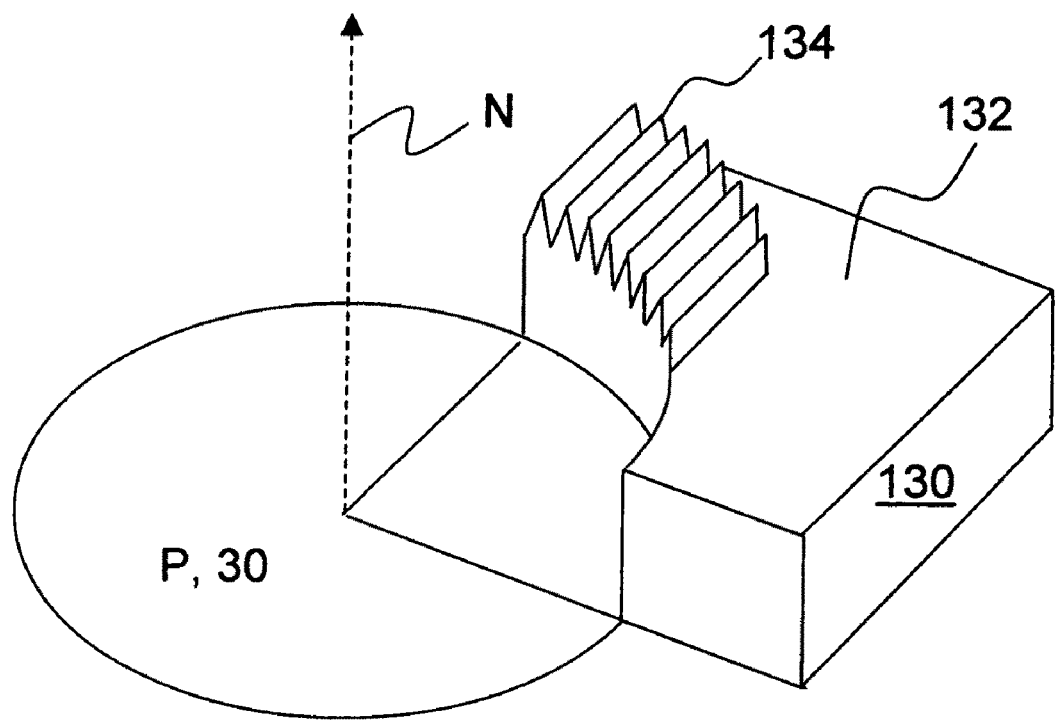
FIG. 10 schematically depicts in perspective view of the spatial relationship of a substrate surface and a shield having a grooved edge contour that is generally perpendicular to the substrate surface.

In general, the edge contour may include a plurality of grooves and/or protrusions that lie in a plane that is substantially parallel to both the substrate surface P and interface $P_i$, as shown in FIG. 7. However, this is not a requirement. As shown in FIG. 10, the edge contour 134 may be perpendicular to the substrate surface P.

The shield geometry used may depend on a number of factors. For example, the geometry shown in FIG. 7 is relatively easy to manufacture relative to the geometry shown in FIG. 10. However, calculations regarding diffractive properties of the edge contour for the geometry shown in FIG. 7 may be more complicated than the calculations for the edge contour shown in FIG. 10. The calculations for the diffractive properties of the edge contour shown in FIG. 10 are typically simpler than that shown in FIG. 7, when the beam strikes the shield at an incident angle near 0°, e.g. 75° relative to substrate surface normal N. Nevertheless, assuming that the incident angle of the beam to the normal of surface P is greater than 45°, the shield of FIG. 10 would have to be more heat tolerant than the shield of FIG. 7 from an operations perspective.

It has been experimentally verified that the use of edge contours that include a plurality of grooves substantially identical V-shaped grooves and/or protrusions is advantageous. The grooves and protrusions may be evenly spaced, e.g., each groove may be equidistant to its nearest neighboring groove. In addition, spacing between neighboring protrusions may be optimized to correspond to the wavelength of the incident beam.

From experiments using a $CO_2$ laser, it has been determined that V-shaped grooves having a vertex-to-vertex distance of about 10 to about 250 times the beam wavelength is particularly useful in mitigating intensity spikes. Such grooves that exhibit an angle of about 55° to about 65° may be used advantageously. With a height of about 1.1 mm to about 1.9 mm, e.g., 1.5 mm, the pitch of the grooves worked out to be about 0.9 mm to about 1.7 mm. Optionally, the serrated area may form an arch of approximately 70° to 100° about the substrate.

Figure 9A:
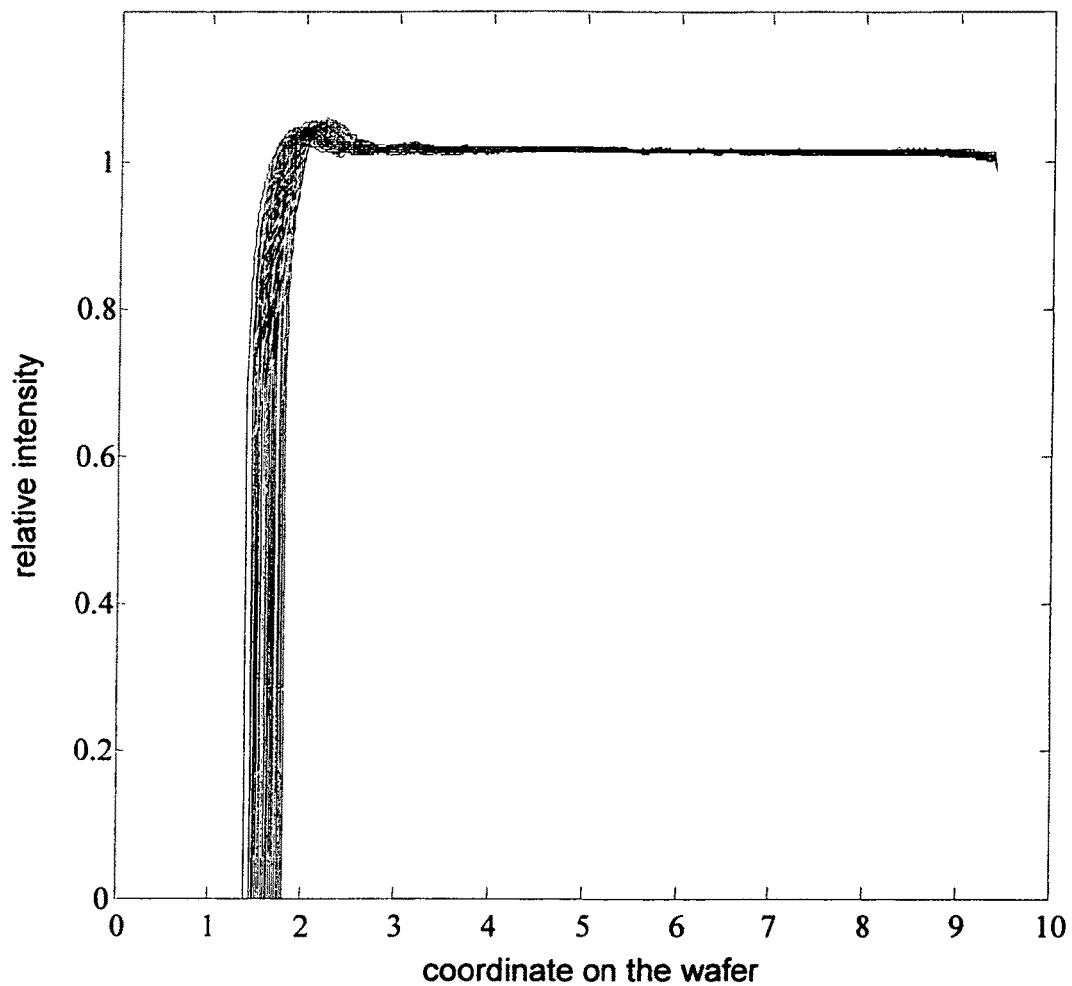
FIGS. 9A and 9B, collectively referred to as FIG. 9, shows plots of beam intensity after interacting with the side and vertex of grooves, respectively.
Figure 9B:
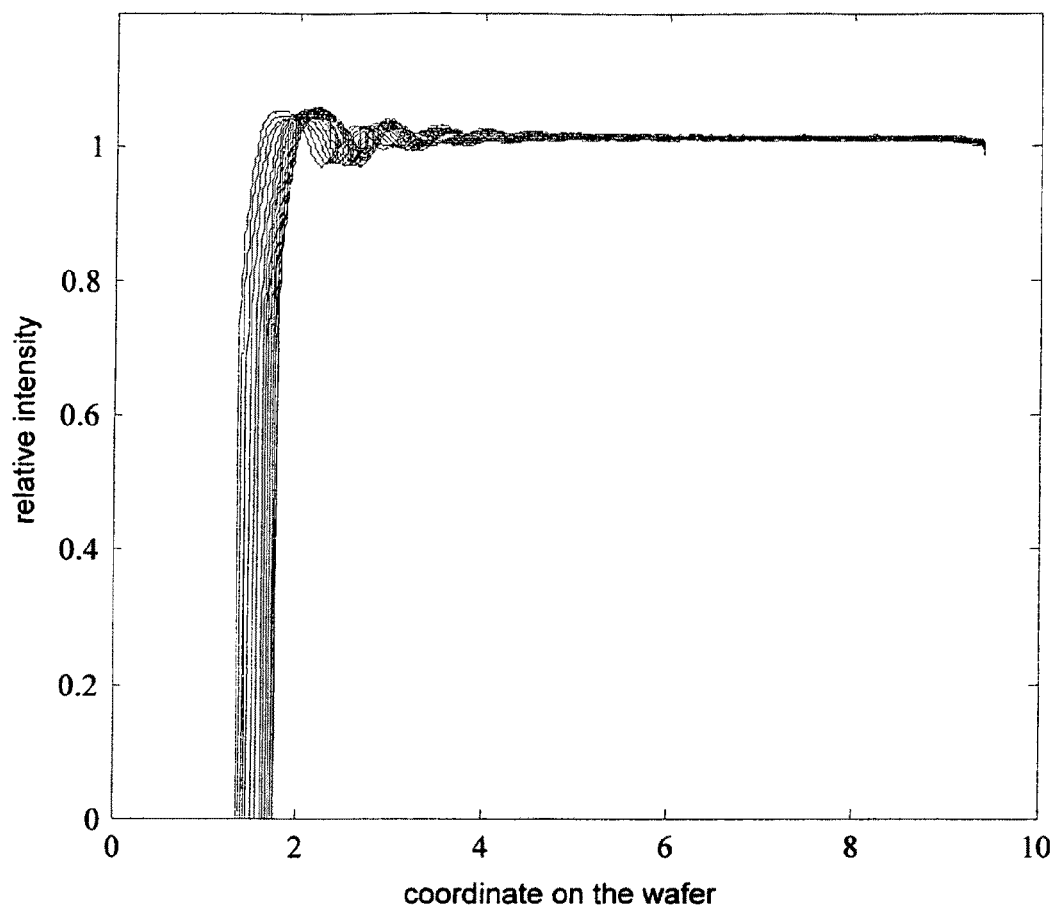

It has also been experimentally determined that the vertices of the grooves and protrusions represent a particularly problematic issue. As shown in FIG. 9A, the intensity profile of light interacting with the sides of the grooves do not show much modulation. However, the intensity profile of light interacting with the vertices of the grooves show a greater degree of modulation. The increased modulation may be addressed by reducing the radius of curvature associated with the grooves and/or protrusions. For example, when the vertex region of each groove or protrusion exhibits a radius less than about five times the beam wavelength, or less than about 50 micrometers, detrimental interference patterns of undesirable intensity variations may be reduced.

Shield 130 may vary by composition. As the vertices of the grooves versus protrusions have a high surface area to volume ratio, the shield material must be chosen carefully so it does not melt, vaporize or chemically decompose when heated by the intense laser beam. In addition, the vertices of the grooves and protrusions are also subject to an intense electromagnetic field in the presence of the laser beam which may lead to their further erosion. Thus, the shield should have a melting temperature and/or reflectivity higher than that of the substrate surface. For example, the shield may be metallic. Metals may be preferred because it is possible to form grooves and protrusion to precise dimensional tolerances. Metals having a higher melting temperature than silicon include, for example, molybdenum and tungsten.

In particular, the shield should have a composition and construction such that its erosion by the laser beam is trivial relative to the thermal process subjected to by the substrate. For example, the shield should not melt and/or evaporate to a significant degree such that material from the shield is deposited on the substrate. Similarly, the shield should maintain its shape such that diffraction effects remain minimized. Thus, the shield should have energy absorption properties relative to the photonic beam such that its effective melting temperature is significantly higher than that of the substrate. Typically, the shield has a greater thermal conductivity than the substrate.

Variations on the Invention

Thus, the invention provides a simple mechanical solution to an otherwise very difficult problem, e.g., permitting a narrow focused beam with an arbitrary intensity profile to be raster scanned across a wafer for thermal processing. In the present invention there is no need to modulate the intensity of the beam to prevent edge damage or to modify the path of the beam across the wafer to select benign entry and exit points around the wafer edge. Nor is there a need to modify the intensity distribution along the length of the beam so that the intensity of the beam lying outside the uniform intensity zone drops rapidly toward zero.

It will be apparent to those of ordinary skill in the art that the invention may be embodied in various forms. For example, high-power $CO_2$ lasers may be used to generate an image, which, in turn, is scanned across a surface of a substrate to effect rapid thermal processing, e.g., melt or non-melt processing, of the substrate surface. Such power levels may provide exposure energy doses of at least about 60 J/cm$^2$ over a 1 ms dwell time. Longer dwells require higher energies. The wavelength of the $CO_2$ laser, $\lambda$, is 10.6 µm in the infrared region, which is large relative to the typical dimensions of wafer features, and may therefore be uniformly absorbed as the beam scans across a patterned silicon wafer with the result that each point on the wafer is raised to very nearly the same maximum temperature.

Additional variations of the present invention will be apparent to those of ordinary skill in the art. For example, while the invention has been described as employing edges having evenly spaced v-shaped protrusions and/or grooves, such protrusions and grooves do not represent a critical aspect of the invention. Other edge geometries may be used as long as detrimental diffraction effects are avoided to ensure that such effects do not interfere with substrate processing.

Upon routine experimentation, those skilled in the art may find that the invention may be incorporated into existing equipment. Auxiliary subsystems known in the art may be used to stabilize the position and the width of the laser beam relative to the relay. Those of ordinary skill in the art will recognize that care must be taken to address to certain operational issues relating to the practice of the invention using powerful lasers to realize the full benefit of the invention.

It is to be understood that, while the invention has been described in conjunction with the preferred specific embodiments thereof, the foregoing description is intended to illustrate and not limit the scope of the invention. Any aspects of the invention discussed herein may be included or excluded as appropriate. For example, beam combining technologies and beam shaping technologies may be used by themselves or in combination. Other aspects, advantages, and modifications within the scope of the invention will be apparent to those skilled in the art to which the invention pertains.

All patents and patent applications mentioned herein are hereby incorporated by reference in their entireties to an extent not inconsistent with the above disclosure.

What is claimed is:

1. An apparatus for processing a surface of a substrate having a central portion, and a peripheral portion with the surface bounded by a downward extending substrate side wall, comprising:

a radiation source adapted to emit a photonic beam of a selected beam wavelength;

a stage adapted to support on a top surface and to move the substrate;

a relay adapted to direct the photonic beam from the radiation source toward the substrate surface at a selected incidence angle and an intensity profile suitable for processing the central portion of the substrate surface;

a shield mounted on the stage interposed between the relay and the substrate with an edge of the shield at a selected distance from or adjacent to the side wall of the substrate without extending above the substrate, the shield having a top surface at a greater height above the top surface of the stage than the surface of the substrate with the shield adapted to block the beam from illuminating the peripheral portion and/or the side wall of the substrate; and a controller operably coupled to the radiation source, relay, shield and/or stage and adapted to provide relative scanning movement between the beam and the stage to advance the beam across the top surface of the shield and onto the surface of the substrate to scan over and process the central portion of the substrate surface in a substantially uniform manner that maintains the intensity profile of any unblocked portion of the beam suitable for processing the central portion of the substrate surface.

2. The apparatus of claim 1, wherein the factors to be considered in determining the blocking of the beam from the peripheral portion and/or side wall of the substrate are the incidence angle of the beam, the position of the shield relative to the side wall of the substrate, the difference in heights of the shield and the substrate and the width of the peripheral portion of the surface of the substrate.

3. The apparatus of claim 1, wherein the radiation source includes a $CO_2$ laser.

4. The apparatus of claim 1, wherein the relay is adapted to form an elongate image.

5. The apparatus of claim 1, wherein the incidence angle is greater than about 45°.

6. The apparatus of claim 5, wherein the incidence angle is about 75°.

7. The apparatus of claim 1, wherein the shield has thermal conductivity and energy absorption properties relative to the photonic beam so the shield does not melt or sputter under conditions suitable for processing the substrate.

8. The apparatus of claim 7, wherein the shield is metallic.

9. The apparatus of claim 1, wherein the shield has an edge having a contour of diffractive characteristics effective to block the beam from the peripheral portion and/or the substrate side wall without detrimental modulation of the intensity profile of the beam on the surface under processing.

10. The apparatus of claim 9, wherein the shield edge contour lies in a plane that is substantially parallel to the substrate side wall.

11. The apparatus of claim 9, wherein the shield edge contour includes a plurality of substantially identical v-shaped grooves.

12. The apparatus of claim 11, wherein each v-shaped groove has an included angle of about 55° to about 65°.

13. The apparatus of claim 11, wherein each groove has a vertex region having a radius of less than about five times the beam wavelength.

14. The apparatus of claim 11, wherein each groove has a neighboring groove and neighboring grooves are approximately equidistant from each other.

15. The apparatus of claim 1, wherein the shield edge contour includes a plurality of substantially identical v-shaped protrusions.

16. The apparatus of claim 15, wherein each v-shaped protrusion has an included angle of about 55° to about 65°.

17. The apparatus of claim 15, wherein each protrusion has a vertex region having a radius of less than about 50 micrometers.

18. The apparatus of claim 15, wherein the protrusions are approximately evenly spaced.

19. The apparatus of claim 15, wherein neighboring protrusions have a vertex-to-vertex distance that is greater than about 10 times the beam wavelength.

20. The apparatus of claim 19, wherein the vertex-to-vertex distance of neighboring protrusion is no greater than about 250 times the beam wavelength.

* * * * *